(12) United States Patent
Annunziata et al.

(10) Patent No.: US 8,767,432 B1
(45) Date of Patent: Jul. 1, 2014

(54) METHOD AND APPARATUS FOR CONTROLLED APPLICATION OF OERSTED FIELD TO MAGNETIC MEMORY STRUCTURE

(71) Applicant: International Business Machines Corporation, Armonk, NY (US)

(72) Inventors: Anthony J. Annunziata, Stamford, CT (US); Michael C. Gaidis, Wappingers Falls, NY (US); Luc Thomas, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 9 days.

(21) Appl. No.: 13/710,616

(22) Filed: Dec. 11, 2012

(51) Int. Cl.
*G11C 19/08* (2006.01)
*G11C 11/16* (2006.01)

(52) U.S. Cl.
CPC ............ *G11C 19/0841* (2013.01); *G11C 11/16* (2013.01)
USPC ............................................ 365/87; 365/158

(58) Field of Classification Search
CPC ............................ G11C 19/0841; G11C 11/16
USPC ................................................... 365/87, 158
See application file for complete search history.

(56) References Cited

U.S. PATENT DOCUMENTS

| | | | |
|---|---|---|---|
| 6,048,739 A * | 4/2000 | Hurst et al. ...................... 438/3 |
| 7,208,807 B2 * | 4/2007 | Horng et al. .................. 257/421 |
| 7,315,470 B2 | 1/2008 | Parkin |
| 7,422,912 B2 | 9/2008 | Anthony et al. |
| 2003/0235074 A1 | 12/2003 | Bloomquist et al. |
| 2007/0165449 A1 * | 7/2007 | Zheng et al. ................... 365/158 |
| 2011/0062538 A1 | 3/2011 | Rizzo et al. |

OTHER PUBLICATIONS

Zhitao Diao, et al.; Spin-transfer torque switching in magnetic tunnel junctions and spin-transfer torque random access memory; IOP Publishing Journal of Physics: Condensed Matter J. Phys.: Condens. Matter 19 (2007) 165209 (13pp).
M. Iwayama, T., et al; Reduction of switching current distribution in spin transfer magnetic random access memories; Journal of Applied Physics 103, 07A720 (2008) (3 pages).
J. L. Tsai; et al.; Current driven domain wall motion in magnetic U-pattern; Journal of Applied Physics 97, 10C710 (2005) (3 pages).

* cited by examiner

*Primary Examiner* — Michael Tran
(74) *Attorney, Agent, or Firm* — Harrington & Smith

(57) ABSTRACT

An apparatus for applying Oersted fields to a magnetic memory device comprises a first metal layer; a first insulating layer positioned on the first metal layer; a magnetic shift register wire positioned on the first insulating layer; a second insulating layer positioned on the magnetic shift register wire; a second metal layer positioned on the second insulating layer; a first conducting wire positioned in the first metal layer and extending transverse to the magnetic shift register wire; and a second conducting wire positioned in the second metal layer and extending transverse to the magnetic shift register wire. The first conducting wire is offset relative to the second conducting wire, the offset being defined by a distance between a first axis normal to the magnetic shift register wire and through the first conducting wire and a second axis normal to the magnetic shift register wire and through the second conducting wire.

16 Claims, 7 Drawing Sheets

US 8,767,432 B1

METHOD AND APPARATUS FOR CONTROLLED APPLICATION OF OERSTED FIELD TO MAGNETIC MEMORY STRUCTURE

BACKGROUND

The exemplary embodiments of this invention relate generally to magnetic memory structures and, more particularly, to methods and apparatuses for applying Oersted fields to control the local magnetization of magnetic memory structures.

Magnetic memory structures are devices that employ magnetic memory cells. Some magnetic memory cells (for example, magnetic random access memory (MRAM)) include a layer of magnetic film in which the magnetization can be altered and a reference layer of magnetic film in which the magnetization is fixed.

In such devices, conducting wires are arranged in grid form and routed across pluralities of the memory cells arranged as an array. Each memory cell at the intersection of two conducting wires stores a piece of information as an orientation of a magnetization of that particular memory cell. External magnetic fields are applied to change the orientation of magnetization, thereby allowing the magnetization of each memory cell in the magnetic film to assume one of two stable orientations (e.g., "1" or "0").

One type of external magnetic field that can be applied is an Oersted field. Oersted fields are magnetic fields that are generated by a flow of electrical current through a conducting wire. Oersted fields can be used to produce a dynamic effect on local magnetizations of magnetic memory devices by changing the orientation of magnetization in the magnetic memory device.

However, many magnetic memory devices require large amounts of current flow to generate magnetic fields of suitable strength to affect the local magnetization in a memory cell. Such large amounts of current may lead to the generation of excess heat as well as undesirable degradation in the performance of a device. Additionally, larger amounts of current flow may result in large stray magnetic fields, which may undesirably affect the magnetization of neighboring memory cells.

BRIEF SUMMARY

In one exemplary embodiment, an apparatus for applying Oersted fields to a magnetic memory device comprises a first metal layer; a first insulating layer positioned on the first metal layer; a magnetic shift register wire positioned on the first insulating layer; a second insulating layer positioned on the magnetic shift register wire; a second metal layer positioned on the second insulating layer; a first conducting wire positioned in the first metal layer and extending transverse to the magnetic shift register wire; and a second conducting wire positioned in the second metal layer and extending transverse to the magnetic shift register wire. The first conducting wire is offset relative to the second conducting wire, the offset being defined by a distance between a first axis extending normal to the magnetic shift register wire and through the first conducting wire and a second axis extending normal to the magnetic shift register wire and through the second conducting wire.

In another exemplary embodiment, a method of controlling a magnetic memory device comprises applying a first Oersted field to a magnetic shift register wire defining a magnetic memory cell of a magnetic memory device and applying a second Oersted field to the magnetic shift register wire. The first Oersted field and the second Oersted field are offset from each other, the offset being defined by a distance between a first axis extending normal to the magnetic shift register wire and through the first Oersted field and a second axis extending normal to the magnetic shift register wire and through the second Oersted field.

In another exemplary embodiment, a method of controlling a magnetic memory device comprises providing a nanowire between a first insulating layer and a second insulating layer; providing a first conducting wire in a plane adjacent to and below the nanowire; providing a second conducting wire in a plane adjacent to and above the nanowire; applying a first current to the first conducting wire to generate a first Oersted field in the first conducting wire; applying a second current to the second conducting wire to generate a second Oersted field in the second conducting wire; and providing an offset between the first conducting wire and the second conducting wire relative to the nanowire.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein.

DETAILED DESCRIPTION

In exemplary embodiments of the present invention, a memory cell device utilizes Oersted fields to control the local magnetization of portions of the device. The device uses the described structure for applying Oersted fields to (1) reduce the current needed per unit of Oersted field generated; (2) enable control of the direction of the Oersted field; and (3) reduce stray fields outside the area where the Oersted field is desired. In achieving these goals, excess heat generation and undesirable degradation in a memory cell device is avoided or at least mitigated.

Figure 1:
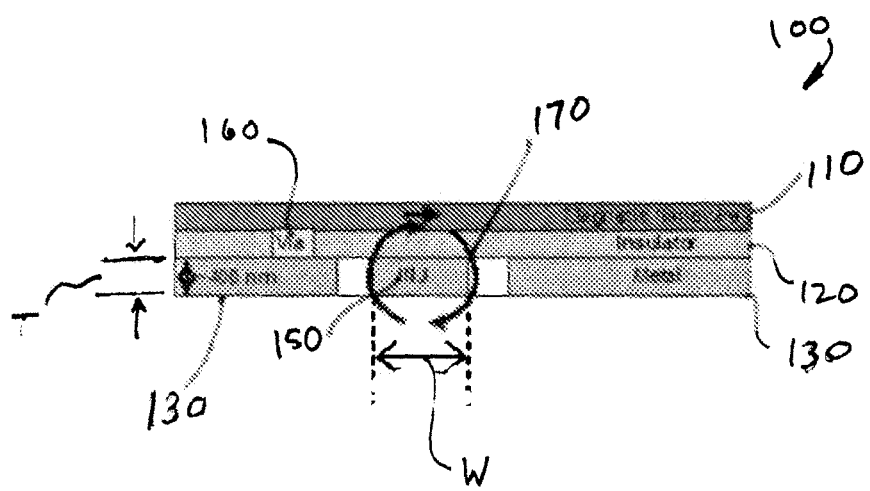
FIG. 1 is a schematic representation of a structure for applying an Oersted field to a single-line conducting wire to control a magnetic memory device.

As shown in FIG. 1, one exemplary embodiment of a memory cell device controllable using Oersted fields is shown generally at 100 and is hereinafter referred to as "device 100." The device 100 may be implemented as a single line design comprising a magnetic shift register wire 110 in the form of a magnetic nanowire, an insulating layer 120 positioned on the magnetic shift register wire 110, and a metal layer 130 positioned on the insulating layer 120. A conductive wire 150 is positioned in the metal layer 130 and extends transverse to the direction in which the magnetic shift register wire 110 extends. Materials from which the magnetic shift register wire 110 may be fabricated include, but are not limited to, NiFe, CoFe, CoFeB, other ferromagnetic alloys, and the like. Materials from which the metal layer 130 may be fabricated include, but are not limited to, copper, aluminum, and the like. In one exemplary embodiment, the metal layer 130 has a thickness T of about 400 nm, and the conductive wire 150 positioned therein is rectangular in cross-section and has a width W of about 500 nm. At least one via 160 may be formed in the insulating layer 120 to form an electrical connection between the magnetic shift register wire 110 and a bottom contact in the metal layer 130.

In the device 100, current is made to flow in the conductive wire 150. In doing so, an Oersted field 170 is generated so as to encircle the conductive wire 150. Generation of the Oersted field 170 causes a localized change in the magnetic orientation of the magnetic shift register wire 110 consistent with the direction of rotation of the Oersted field 170.

Figure 2:
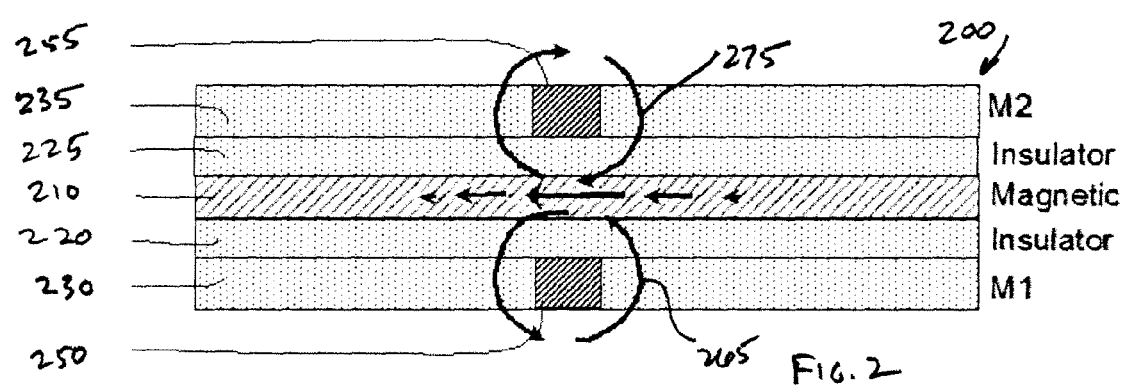
FIG. 2 is a schematic representation of a structure for applying Oersted fields to dual-line conducting wires to control a magnetic memory device.
Figure 3:
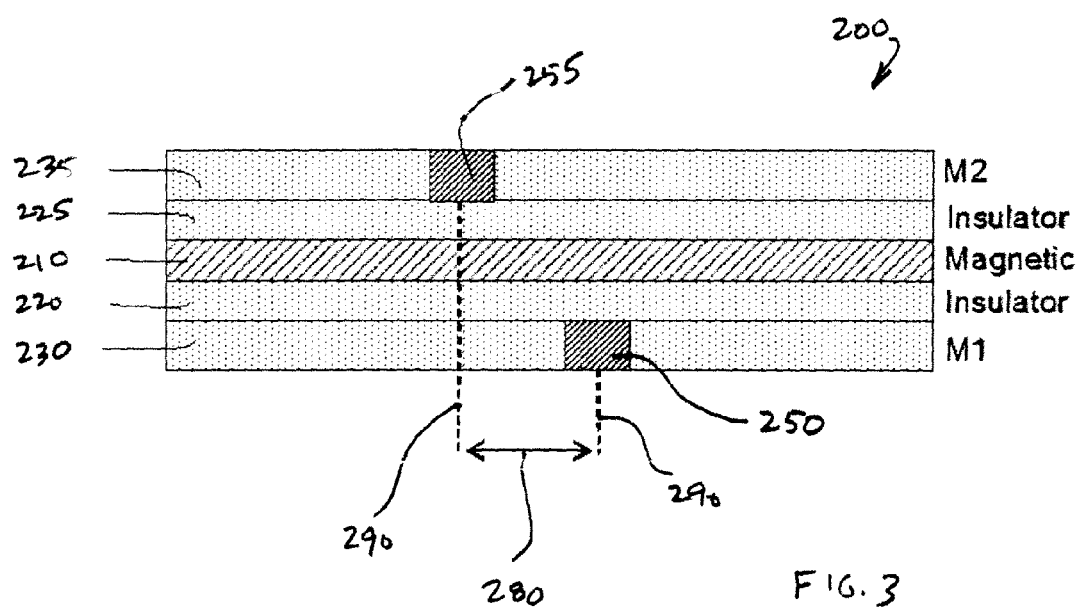
FIG. 3 is a schematic representation of the structure of FIG. 2 in which the conducting wires are offset from each other.
Figure 4:
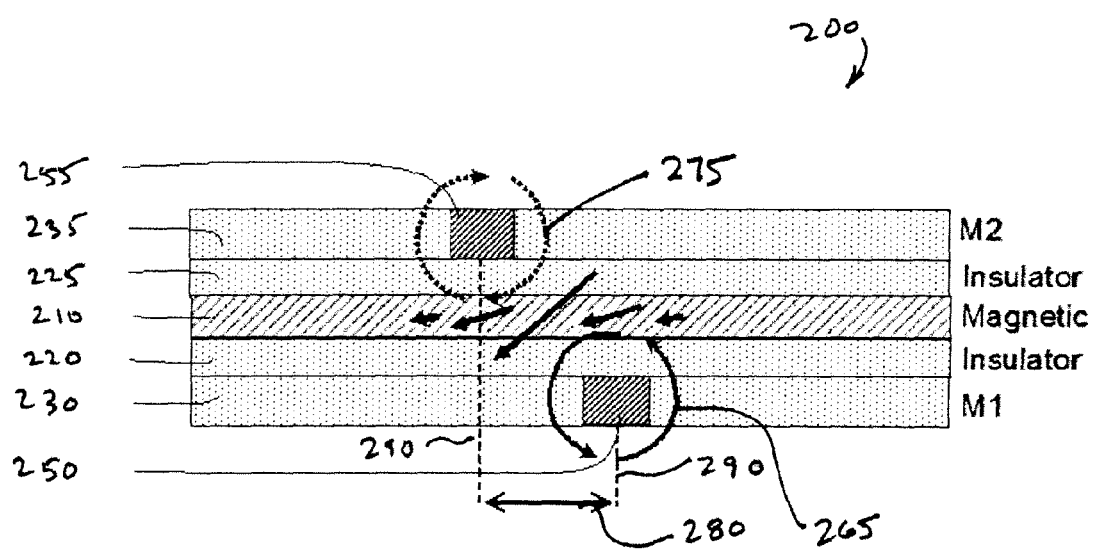
FIG. 4 is a schematic representation of the structure of FIG. 3 in which Oersted fields are applied.

In another exemplary embodiment as shown in FIGS. 2-4, a device employing Oersted fields to control local magnetization is shown generally at 200 and is hereinafter referred to as "device 200." Referring to FIG. 2, the device 200 is implemented in a mask set comprising a first metal layer 230, a first insulating layer 220 positioned on the first metal layer 230, a magnetic shift register wire 210 (e.g., a nanowire) positioned on the first insulating layer 220, a second insulating layer 225 positioned on the magnetic shift register wire 210, and a second metal layer 235 positioned on the second insulating layer 225. Materials from which the first metal layer 230 and the second metal layer 235 may be fabricated include, but are not limited to, copper, aluminum, and the like. A first conducting wire 250 is located in the first metal layer 230, and a second conducting wire 255 is located in the second metal layer 235. The first conducting wire 250 is oriented parallel to the second conducting wire 255, and the magnetic shift register wire 210 extends transverse to the directions in which the first conducting wire 250 and the second conducting wire 255 extend. Both the first conducting wire 250 and the second conducting wire 255 are rectangular in cross section. The exemplary embodiments as described herein are not limited in this regard, however, as one or both of the first conducting wire 250 and the second conducting wire 255 may be circular in cross section.

The first conducting wire 250 and the second conducting wire 255 may be coupled together at a remote location such that the first conducting wire 250 and the second conducting wire 255 form a continuous current path. As used herein, the term "remote location" indicates a place of a suitable distance such that a magnetic interference is not caused by the first conducting wire 250 or the second conducting wire 255. When such a continuous path is formed, an electrical current can flow continuously into one of the wires and out of the other of the wires such that the Oersted fields between the two wires due to the current flow are increased in magnitude relative to a single wire carrying the same current. In one simplified exemplary embodiment, the magnitude of the current flow is doubled.

As shown in FIG. 2, the first conducting wire 250 and the second conducting wire 255 are positioned transverse relative to the magnetic shift register wire 210 and disposed directly over one another. In such an arrangement, the Oersted field is parallel to the plane of the magnetic shift register and oriented along the magnetic shift register wire 210. In this arrangement, the current flow is in one direction (for example, into the first conducting wire 250 and out of the second conducting wire 255), which produces an Oersted field (shown at 265) of counterclockwise orientation along the first conducting wire 250 and an Oersted field (shown at 275) of clockwise orientation along the second conducting wire 255. Because there is no offset of the first conducting wire 250 and the second conducting wire 255, the magnetic orientation has a completely horizontal component in the magnetic shift register wire 210.

As shown in FIG. 3, the first conducting wire 250 is spaced from the second conducting wire 255 by an offset distance 280. The first metal layer 230, the first insulating layer 220, the second insulating layer 225, the second metal layer 235, and a plane in which the magnetic shift register wire 210 is located are all positioned to be parallel relative to each other. The offset distance 280 is defined by a distance between a first axis extending normal to the magnetic shift register wire 210 and through the first conducting wire 250 and a second axis extending normal to the magnetic shift register wire 210 and through the second conducting wire 255.

As shown in FIG. 4, when the first conducting wire 250 and the second conducting wire 255 are positioned proximate each other such that currents carried by each wire flow in opposite directions, the magnetic orientation in the magnetic shift wire 210 depends on the offset distance 280 between the wires 250, 255. When the offset distance 280 is non-zero (i.e. when the first conducting wire 250 and the second conducting wire 255 are offset from each other relative to axes 290 that extend normal to the direction in which the magnetic shift register wire 210 extends), both the Oersted field 265 and the Oersted field 275 cause the magnetic orientation in the magnetic shift wire 210 to have both horizontal and vertical components. Depending on the specific magnitude of the offset distance 280, the magnetic orientation in the magnetic shift register wire 210 can have a sizable vertical component. Such control of the vertical component allows for localized control of the magnetic orientation in the magnetic shift register wire 210. In other words, portions of the magnetic shift register wire 210 may be magnetically oriented in one direction due to the vertical component, and other portions of the magnetic shift register wire 210 may be magnetically oriented in another direction due to the horizontal component. The magnetic shift register wire 210 can be read out by using a current to push domain walls separating magnetic domains down the magnetic shift register wire 210 toward a magnetic tunnel junction read sensor.

In the exemplary embodiments described herein, useful offset distances 280 are up to about 5 micrometers (um) with typical first conducting wires 250 and second conducting wires 255 having cross sectional dimensions of about 100 nm to about 500 nm by about 100 nm to about 500 nm. A vertical spacing of the first conducting wires 250 and second conducting wires 255 is generally about 50 nm to about 500 nm.

As shown in FIGS. 2 and 4, components of the Oersted field 265 and the Oersted field 275 that are perpendicular to the magnetic shift register wire 210 outside of the immediate area between the first conducting wires 250 and second conducting wires 255 (which carry currents of equal magnitudes in opposite directions when the wires 250, 255 are remotely connected) are reduced relative to a single conducting wire having the same amount of current flowing therethrough. Thus, the use of two currents of equal magnitude flowing in opposing directions effectively cancels stray fields away from the location where the Oersted fields are applied.

Irrespective of whether the first conducting wire 250 and second conducting wire 255 are connected, a time-dependent current pulse (e.g., a sine wave, a triangle wave, or the like)

can be applied to the first conducting wire 250 and the second conducting wire 255 to produce complex time-dependent field patterns. Such complex time-dependent field patterns can allow for customized control of the magnetic orientation in the magnetic shift register wire 210.

If the first conducting wire 250 and second conducting wire 255 are connected and a time-dependent current pulse is applied to the first conducting wire 250 and second conducting wire 255 with a purposely-designed path length difference, or if the first conducting wire 250 and second conducting wire 255 are connected and a time-dependent current pulse is applied to the first conducting wire 250 and second conducting wire 255 with purposely-designed load terminations, then additional complex time-dependent field patterns can be produced.

Other structures of similar size and geometry (e.g., containing more than two conducting wires, remotely connected or unconnected or in any combination thereof, and perpendicular or otherwise oriented with respect to the magnetic shift register wire 210) would allow for more complicated spatial or time dependencies of the Oersted field.

Figure 5:
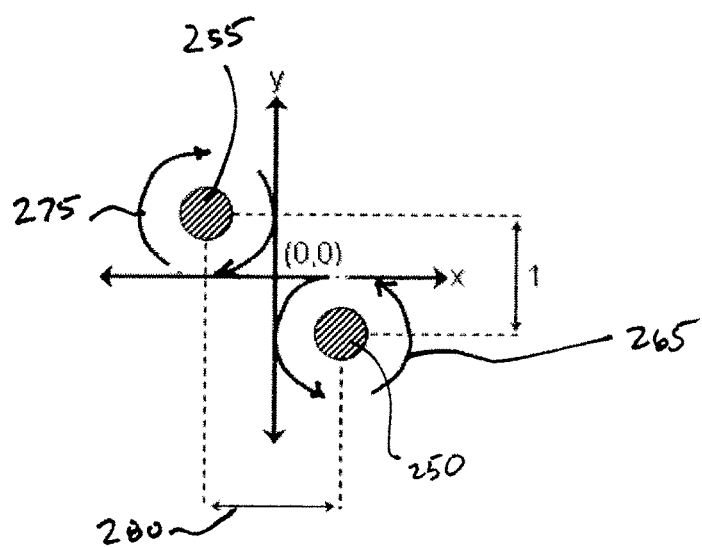
FIG. 5 is a schematic representation of first and second conducting wires for the calculation of Oersted field strength.

As shown in FIG. 5, x and y components of Oersted fields 265, 275 are calculated for an arrangement in which the first conducting wire 250 and the second conducting wire 255 are offset by the offset distance 280 and in which the cross sections of the wires 250, 255 are assumed to be circular. In this arrangement, each of the first conducting wire 250 and the second conducting wire 255 carries a current of magnitude I flowing in opposing directions. The strength of each Oersted field 265, 275 is calculated as an arbitrary unit using the equation $(u_oI)/(2\pi)=1$ where $u_o$ is magnetic permeability. The strength of each Oersted field 265, 275 in arbitrary units can also be calculated for a single conducting wire carrying the same current and in the same location as one conducting wire with zero offset (FIG. 6).

Figure 6:
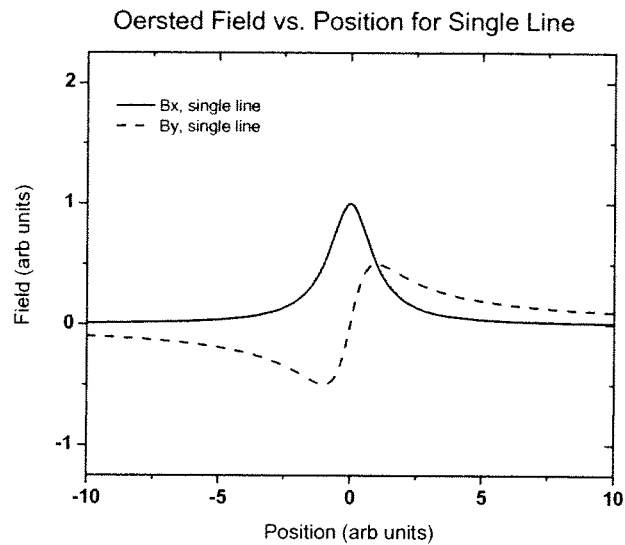
FIG. 6 is a graphical representation of the application of an Oersted field to a single line conducting wire.
Figure 7:
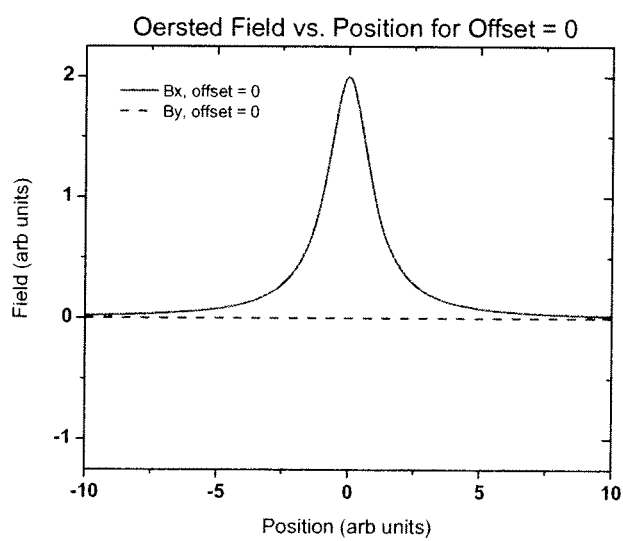
FIG. 7 is a graphical representation of the application of Oersted fields to a dual-line arrangement of conducting wires with an offset of zero.
Figure 8:
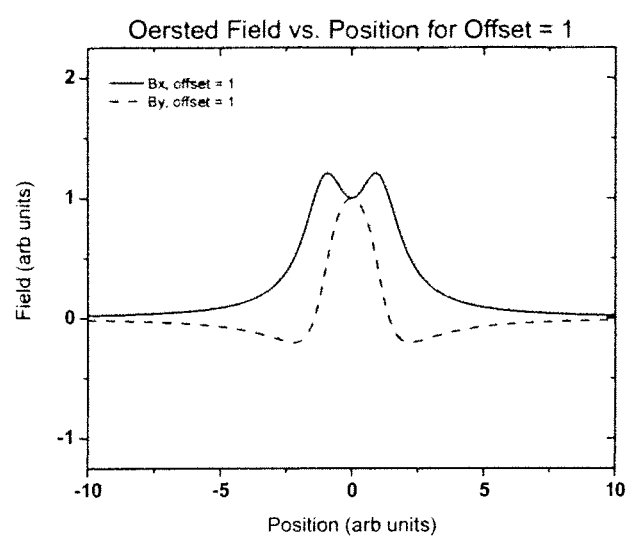
FIG. 8 is a graphical representation of the application of Oersted fields to a dual-line arrangement of conducting wires with an offset of one.

As shown in FIGS. 6-8, the strength of each Oersted field 265, 275 in arbitrary units is plotted versus the position of each conducting wire 250, 255 for various offset values. As shown in FIG. 6, for the single conducting wire (e.g., the first conducting wire 250), the strength of an Oersted field (e.g., the Oersted field 265) has an x component that increases from zero to about one and then decreases back to zero. The y component decreases from about zero to about negative one half, then increases and passes through the abscissa (strength of zero) to about positive one half, after which it decreases back to about zero.

As shown in FIG. 7, for the first conducting wire 250 and the second conducting wire 255 arranged with no offset, the x component increases from zero to about two, then decreases back to zero, while the y component remains at zero.

As shown in FIG. 8, when the first conducting wire 250 is offset from the second conducting wire 255, the x component and the y component behave as shown. Given that the field strength of each Oersted field 265, 275 is kept at a minimum compared to the configurations as plotted in FIGS. 6 and 7, the exemplary arrangement in which the first conducting wire 250 and the second conducting wire 255 are offset is the most desirable and results in a reduction in current required, provides control of the direction of the Oersted field, and reduces the occurrence of stray magnetic fields.

The terminology used herein is for the purpose of describing particular exemplary embodiments only and is not intended to be limiting of the exemplary embodiments of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Any use of the terms "connected," "coupled," or variants thereof should be interpreted to indicate any such connection or coupling, direct or indirect, between the identified elements. As a non-limiting example, one or more intermediate elements may be present between the "coupled" elements. The connection or coupling between the identified elements may be, as non-limiting examples, physical, electrical, magnetic, logical, or any suitable combination thereof in accordance with the described exemplary embodiments. As non-limiting examples, the connection or coupling may comprise one or more printed electrical connections, wires, cables, mediums, or any suitable combination thereof.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. However, all such and similar modifications will still fall within the scope of the teachings of the exemplary embodiments of the invention.

Furthermore, some of the features of the exemplary embodiments of this invention could be used to advantage without the corresponding use of other features. As such, the foregoing description should be considered as merely illustrative of the principles of the invention, and not in limitation thereof.

The invention claimed is:

1. An apparatus for applying Oersted fields to a magnetic memory device, the apparatus comprising:
   a first metal layer;
   a first insulating layer positioned on the first metal layer;
   a magnetic shift register wire positioned on the first insulating layer;
   a second insulating layer positioned on the magnetic shift register wire;
   a second metal layer positioned on the second insulating layer;
   a first conducting wire positioned in the first metal layer and extending transverse to the magnetic shift register wire; and
   a second conducting wire positioned in the second metal layer and extending transverse to the magnetic shift register wire;
   wherein the first conducting wire is offset relative to the second conducting wire, the offset being defined by a distance between a first axis extending normal to the magnetic shift register wire and through the first conducting wire and a second axis extending normal to the magnetic shift register wire and through the second conducting wire.

2. The apparatus of claim 1, wherein the first conducting wire is coupled to the second conducting wire such that current flows through the first conducting wire in the first metal layer in a first direction and through the second conducting wire in the second metal layer in an opposite direction.

3. The apparatus of claim 2, wherein the first conducting wire is coupled to the second conducting wire at a location remote from the magnetic shift register wire.

4. The apparatus of claim 1, wherein the offset distance is up to about 5 um.

5. The apparatus of claim 1, wherein a spacing of the first conducting wire from the second conducting wire is about 50 nm to about 500 nm.

6. The apparatus of claim 1, wherein a time-dependent current pulse is applied to the first conducting wire and the second conducting wire.

7. The apparatus of claim 1, wherein a cross-section of the first conducting wire and a cross-section of the second conducting wire is rectangular.

8. The apparatus of claim 1, wherein a cross-section of the first conducting wire and a cross-section of the second conducting wire is round.

9. A method of controlling a magnetic memory device, comprising:
   applying a first Oersted field to a magnetic shift register wire routed across a magnetic memory cell of a magnetic memory device; and
   applying a second Oersted field to the magnetic shift register wire;
   wherein the first Oersted field and the second Oersted field are offset from each other, the offset being defined by a distance between a first axis extending normal to the magnetic shift register wire and through the first Oersted field and a second axis extending normal to the magnetic shift register wire and through the second Oersted field.

10. The method of claim 9, wherein applying a first Oersted field comprises generating a current in a first conducting wire extending transverse to the magnetic shift register wire, and wherein applying a second Oersted field comprises generating a current in a second conducting wire extending transverse to the magnetic shift register wire.

11. The method of claim 10, wherein generating a current in a first conducting wire extending transverse to the magnetic shift register wire comprises generating a first time-pulse current in the first conducting wire, and wherein generating a current in a second conducting wire extending transverse to the magnetic shift register wire comprises generating a second time-pulse current in the second conducting wire.

12. The method of claim 10, wherein the first conducting wire is coupled to the second conducting wire so that the current generated in the first conducting wire is the current generated in the second conducting wire.

13. The method of claim 9, wherein the offset of the first Oersted field relative to the second Oersted field produces both a localized vertical orientation and a horizontal orientation in the magnetic shift wire.

14. A method of controlling a magnetic memory device, comprising:
   providing a nanowire between a first insulating layer and a second insulating layer;
   providing a first conducting wire in a plane adjacent to and below the nanowire;
   providing a second conducting wire in a plane adjacent to and above the nanowire;
   applying a first current to the first conducting wire to generate a first Oersted field in the first conducting wire;
   applying a second current to the second conducting wire to generate a second Oersted field in the second conducting wire; and
   providing an offset between the first conducting wire and the second conducting wire relative to the nanowire.

15. The method of claim 14, wherein the first conducting wire is coupled to the second conducting wire so that applying the first current to the first conducting wire applies the second current to the second conducting wire.

16. The method of claim 14, wherein the offset between the first conducting wire and the second conducting wire relative to the nanowire produces both a localized vertical orientation and a horizontal orientation in the nanowire.

* * * * *